US012660137B2

(12) United States Patent

Luo et al.

(10) Patent No.: US 12,660,137 B2

(45) Date of Patent: Jun. 16, 2026

(54) POWER MODULE COOLING SYSTEM

(71) Applicant: GM GLOBAL TECHNOLOGY OPERATIONS LLC, Detroit, MI (US)

(72) Inventors: Yilun Luo, Ann Arbor, MI (US);
Ronald O. Grover, Jr., Northville, MI (US); Sanjeev M. Naik, Troy, MI (US);
Chandra S. Namuduri, Troy, MI (US);
Rashmi Prasad, Troy, MI (US);
Junghoon Kim, Ann Arbor, MI (US);
Peng Peng, Columbus, OH (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 269 days.

(21) Appl. No.: 18/474,637

(22) Filed: Sep. 26, 2023

(65) Prior Publication Data

US 2025/0107051 A1 Mar. 27, 2025

(51) Int. Cl.
*H05K 7/20* (2006.01)

(52) U.S. Cl.
CPC ................................. *H05K 7/20927* (2013.01)

(58) Field of Classification Search
CPC .................................................. H05K 7/20927
See application file for complete search history.

(56) References Cited

U.S. PATENT DOCUMENTS

| | | | |
|---|---|---|---|
| 9,888,617 B2 * | 2/2018 | Ishiyama | .............. H01L 23/473 |
| 11,134,587 B2 * | 9/2021 | Olesen | ............... H05K 7/20927 |
| 2017/0331183 A1 * | 11/2017 | Lenk | .................... H01Q 19/062 |

* cited by examiner

*Primary Examiner* — Mukundbhai G Patel

(74) *Attorney, Agent, or Firm* — CANTOR COLBURN LLP

(57) ABSTRACT

Embodiments of the present disclosure are directed to power module cooling systems. In particular, some embodiments of the present disclosure relate to power module cooling systems with structures to generate three-dimensional swirling and tumbling in liquid coolant flowing within a chamber of the cooling system. Other embodiments may be disclosed or claimed.

20 Claims, 9 Drawing Sheets

POWER MODULE COOLING SYSTEM

INTRODUCTION

The subject disclosure relates to power module cooling systems. In particular, embodiments of the present disclosure relate to power module cooling systems with structures to generate three-dimensional swirling and tumbling in liquid coolant flowing within a chamber of the cooling system.

Power modules are used in a variety of different systems and applications. For example, in electric or hybrid vehicles, power modules are often used in conjunction with multilevel inverter systems coupled between the battery and electric motor of the vehicle.

In many applications, power modules (particularly those with relatively high power dissipation) require liquid cooling systems to function. Embodiments of the present disclosure provide power module cooling systems with enhanced capabilities to increase thermal conductivity, facilitate efficient manufacturing, and allow multiple power modules to be cooled with a single cooling system to reduce the overall power module footprint in space-constrained applications (such as in vehicles).

SUMMARY

In one exemplary embodiment, a power module cooling system is provided. The power module cooling system comprises a housing having a chamber defined by a top portion, a bottom portion opposite the top portion, and a plurality of sides. The power module cooling system further includes an inlet to allow a liquid coolant to enter the chamber, an outlet to allow the liquid coolant to exit the chamber, a first set of fins extending from the top portion into the chamber, and a second set of fins extending from the bottom portion into the chamber, wherein the first set of fins do not contact the bottom portion, the second set of fins do not contact the top portion, and the first set of fins overlap the second set of fins in both a first plane and a second plane orthogonal to the first plane.

In addition to one or more of the features described herein, the housing has an exterior, the exterior of the top portion is adapted to couple to a first power module, and the exterior of the bottom portion is adapted to couple to a second power module, wherein the power module cooling system simultaneously cools the first power module and the second power module as the liquid coolant traverses the first set of fins and the second set of fins between the inlet and the outlet within the chamber.

In addition to one or more of the features described herein, the liquid coolant swirls and tumbles as the liquid coolant traverses the first set of fins and the second set of fins between the inlet and the outlet within the chamber.

In addition to one or more of the features described herein, the housing has a length between a first side and a second side opposite to the first side, a width between a third side and a fourth side opposite to the third side, and a height between the top portion and the bottom portion.

In addition to one or more of the features described herein, the inlet is in the first side and the outlet is in the second side, or the inlet is in the top portion and the outlet is in the bottom portion.

In addition to one or more of the features described herein, the length is greater than the width, and wherein the inlet is in the third side and the outlet is in the fourth side.

In addition to one or more of the features described herein, at least one of: a connection between at least one of the fins in the first set of fins and the top portion is rounded; and a connection between at least one of the fins in the second set of fins and the bottom portion is rounded.

In addition to one or more of the features described herein, the housing includes a plurality of inlets and a plurality of outlets.

In another exemplary embodiment, a power module cooling system comprises a housing having an exterior and a chamber defined by a top portion, a bottom portion opposite the top portion, and a plurality of sides. The power module cooling system includes an inlet to allow a liquid coolant to enter the chamber, an outlet to allow the liquid coolant to exit the chamber, a first set of fins extending from the top portion into the chamber, and a second set of fins extending from the bottom portion into the chamber. The first set of fins do not contact the bottom portion, the second set of fins do not contact the top portion, and the first set of fins overlap the second set of fins in both a first plane and a second plane orthogonal to the first plane. The exterior of the top portion is adapted to couple to a first power module, the exterior of the bottom portion is adapted to couple to a second power module, and the power module cooling system simultaneously cools the first power module and the second power module as the liquid coolant traverses the first set of fins and the second set of fins between the inlet and the outlet within the chamber.

In addition to one or more of the features described herein, the liquid coolant swirls and tumbles as the liquid coolant traverses the first set of fins and the second set of fins between the inlet and the outlet within the chamber.

In addition to one or more of the features described herein, the housing has a length between a first side and a second side opposite to the first side, a width between a third side and a fourth side opposite to the third side, and a height between the top portion and the bottom portion.

In addition to one or more of the features described herein, the inlet is in the first side and the outlet is in the second side, or the inlet is in the top portion and the outlet is in the bottom portion.

In addition to one or more of the features described herein, the length is greater than the width, and wherein the inlet is in the third side and the outlet is in the fourth side.

In addition to one or more of the features described herein, at least one of: a connection between at least one of the fins in the first set of fins and the top portion is rounded, and a connection between at least one of the fins in the second set of fins and the bottom portion is rounded.

In addition to one or more of the features described herein, the housing includes a plurality of inlets and a plurality of outlets.

In another exemplary embodiment, a vehicle comprises a first power module, a second power module, and a power module cooling system. The power module cooling system includes a housing having an exterior and a chamber defined by a top portion, a bottom portion opposite the top portion, and a plurality of sides. The power module cooling system includes an inlet to allow a liquid coolant to enter the chamber, an outlet to allow the liquid coolant to exit the chamber, a first set of fins extending from the top portion into the chamber, and a second set of fins extending from the bottom portion into the chamber. The first set of fins do not contact the bottom portion, the second set of fins do not contact the top portion, and the first set of fins overlap the second set of fins in both a first plane and a second plane orthogonal to the first plane. The exterior of the top portion is adapted to couple to the first power module, the exterior of the bottom portion is adapted to couple to the second power module, and the power module cooling system simultaneously cools the first power module and the second power module as the liquid coolant traverses the first set of fins and the second set of fins between the inlet and the outlet within the chamber.

In addition to one or more of the features described herein, the liquid coolant swirls and tumbles as the liquid coolant traverses the first set of fins and the second set of fins between the inlet and the outlet within the chamber.

In addition to one or more of the features described herein, the housing has a length between a first side and a second side opposite to the first side, a width between a third side and a fourth side opposite to the third side, and a height between the top portion and the bottom portion.

In addition to one or more of the features described herein, the inlet is in the first side and the outlet is in the second side, or the inlet is in the top portion and the outlet is in the bottom portion.

In addition to one or more of the features described herein, the length is greater than the width, and wherein the inlet is in the third side and the outlet is in the fourth side.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
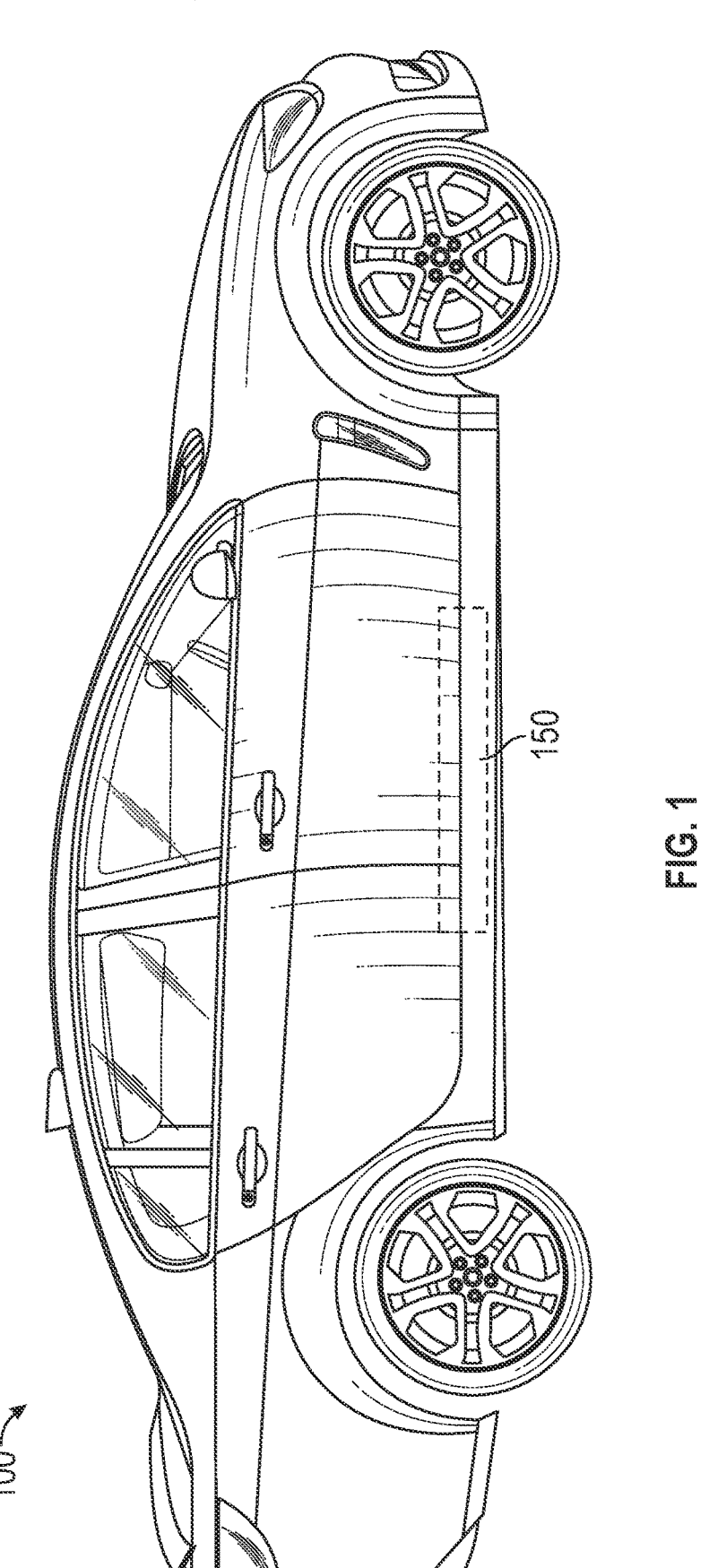
FIG. 1 is a schematic diagram of a vehicle for use in conjunction with embodiments of the present disclosure.

The following description is merely exemplary in nature and is not intended to limit the present disclosure, its application or uses. It should be understood that throughout the drawings, corresponding reference numerals indicate like or corresponding parts and features.

Embodiments of power module cooling systems are described herein. Among other things, embodiments of the disclosure help enable three-dimensional swirling and tumbling of liquid coolant through the cooling system to increase thermal conductivity relative to other cooling systems. Embodiments of the present disclosure also provide overlapping patterns of fins that can be efficiently manufactured and can be utilized to cool multiple power modules simultaneously. While embodiments of the present disclosure are described herein with reference to the cooling of power modules, alternate embodiments of cooling systems may be used to cool other components and systems. Additionally, cooling systems of the present disclosure may be used to cool one or more different components (e.g., single or double-sided cooling of power modules or other components).

The novel power module cooling systems of the present disclosure allow for the enhanced liquid cooling of power modules by providing three-dimensional cooling channels to create complex swirling and tumbling flow in orthogonal planes to increase thermal conductivity and reduce pumping pressure drop and loss. Some embodiments of the present disclosure may also provide a symmetric structure to help facilitate efficient manufacturability and cost reduction. Embodiments further allow the installation of power modules on both sides of the cooling system to reduce system size and increase power density, beneficial for systems such as multilevel inverters (used in electric and hybrid vehicles) which have relatively high switch counts.

Referring now to FIG. 1, a schematic diagram of a vehicle 100 for use in conjunction with one or more embodiments of the present disclosure is shown. In this example, the power module cooling system 150 is located proximate with a battery pack that is used to supply power to an electric motor to propel the vehicle.

Figure 2:
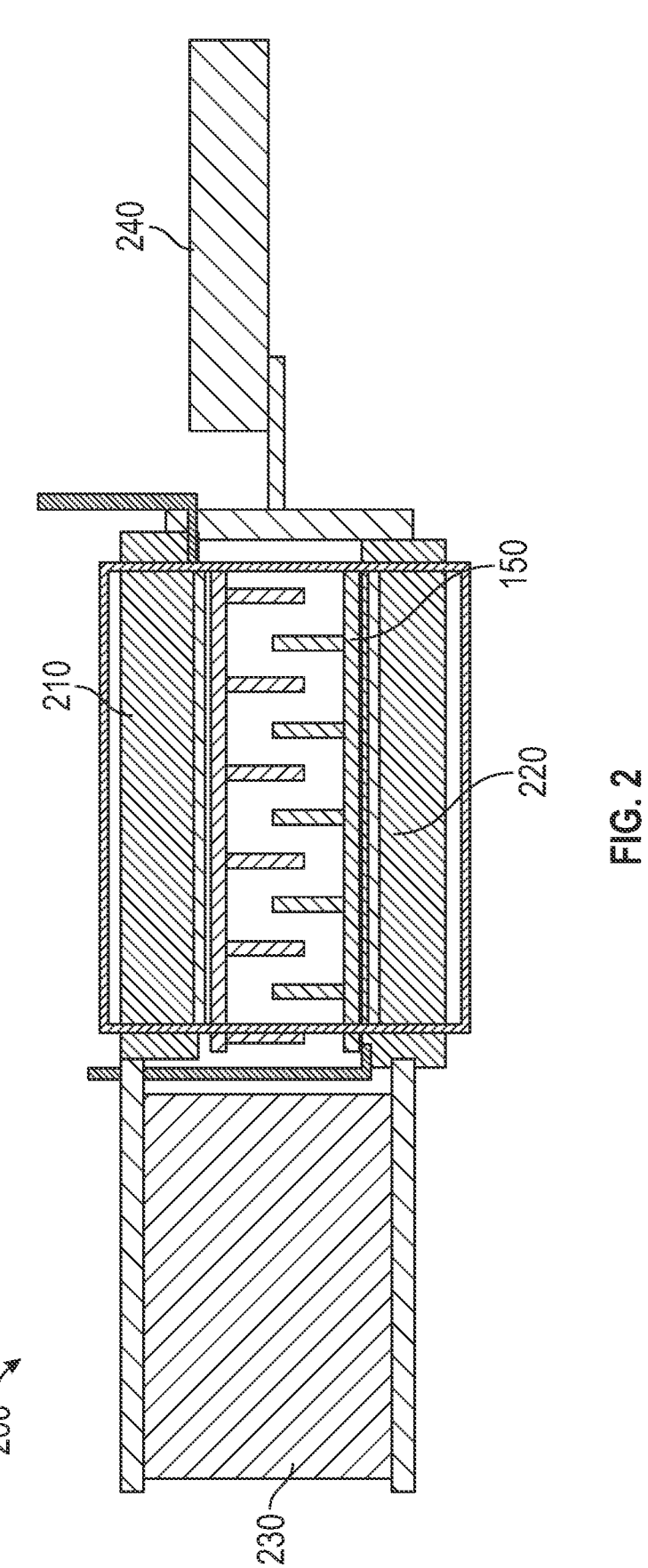
FIG. 2 is a schematic diagram of an inverter system in accordance with embodiments of the present disclosure.

FIG. 2 is a schematic diagram of an inverter system 200 in accordance with embodiments of the present disclosure. In this example, the inverter system 200 (shown from the side) includes power module cooling system 150 with a first power module 210 coupled to the top of the power module cooling system 150 and a second power module 220 coupled to the bottom of the power module cooling system 150. In this example, the power modules 210, 220 of inverter system 200 are coupled to a capacitor 230 that is in turn coupled to a high-voltage energy storage system (not shown) such as the battery pack of vehicle 100. The power modules 210, 220 are also coupled, at block 240, to the electric motor of vehicle 100.

Figure 3A:
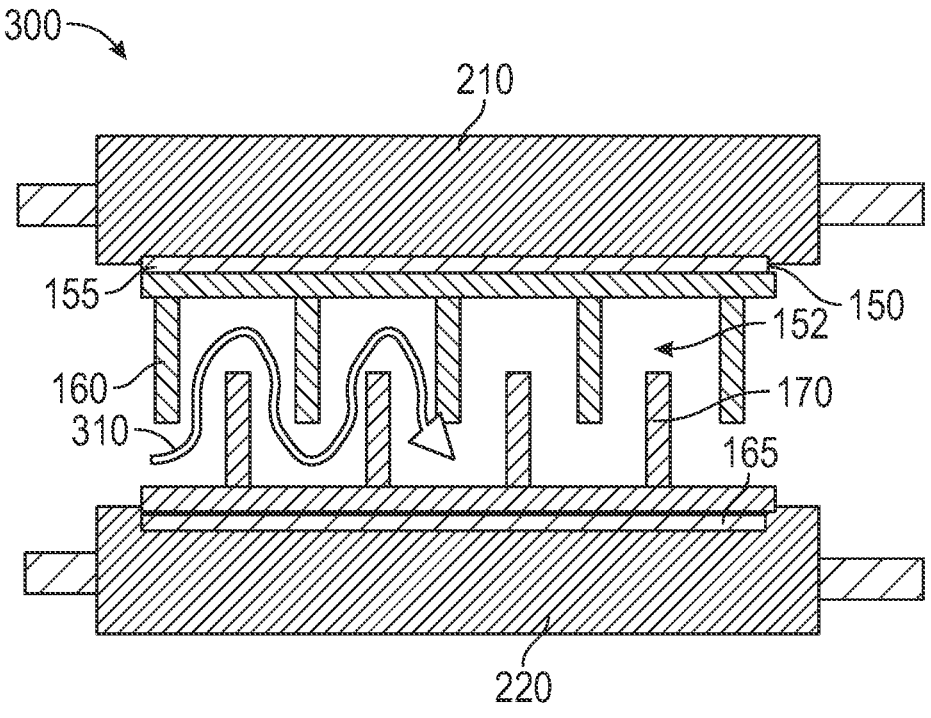
FIG. 3A is a side view of a system in accordance with embodiments of the present disclosure.

FIG. 3A is a side view of a system in accordance with embodiments of the present disclosure. In this example, system 300 (viewed from the side) includes power module cooling system 150 that comprises a housing having a chamber 152 defined by a top portion 155, a bottom portion 165 opposite the top portion 155, and a plurality of sides (not shown in this cutaway side view). FIG. 3A shows the flow 310 of a liquid coolant that enters the chamber 152 through an inlet (not shown) in the left sidewall of the cooling system 150 and that will run through an outlet (not shown) in the right sidewall of the cooling system. The cooling system 150 includes a first set of fins 160 extending from the top portion 155 into the chamber 152, and a second set of fins 170 extending from the bottom portion 165 into the chamber 152. As shown, the first set of fins 160 do not contact the bottom portion 165, and the second set of fins 170 do not contact the top portion 155. The first set of fins 160 overlap the second set of fins 170 in both a first plane (e.g., the X-Z plane shown in FIG. 3A) and a second plane orthogonal to the first plane (e.g., the X-Y plane shown by the top view of the cooling system in FIG. 3B). In alternate embodiments, fins of the cooling system need not be parallel or orthogonal to each other, but may be formed at any suitable angle relative to each other.

Figure 3B:
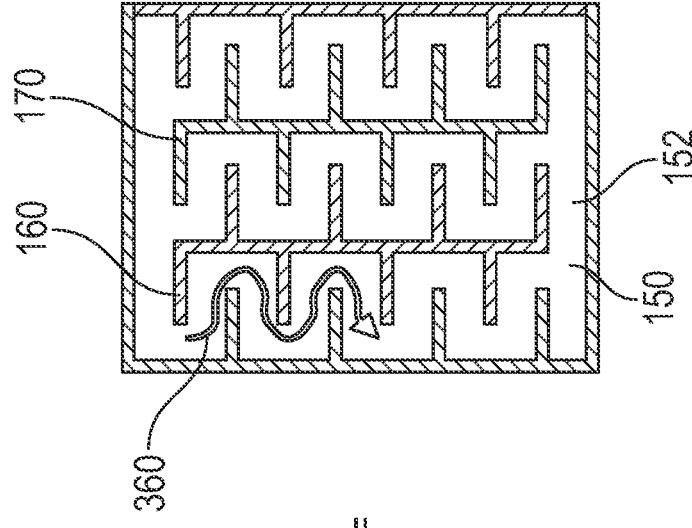
FIG. 3B illustrates top views of the power module cooling system in FIG. 3A in accordance with embodiments of the present disclosure.
Figure 3B:
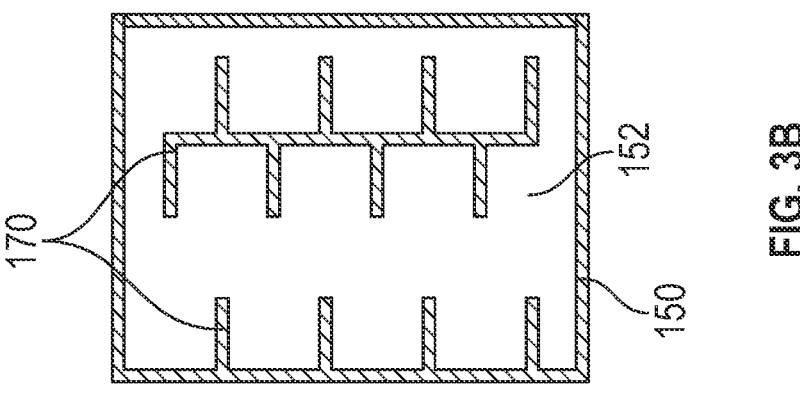
Figure 3B:
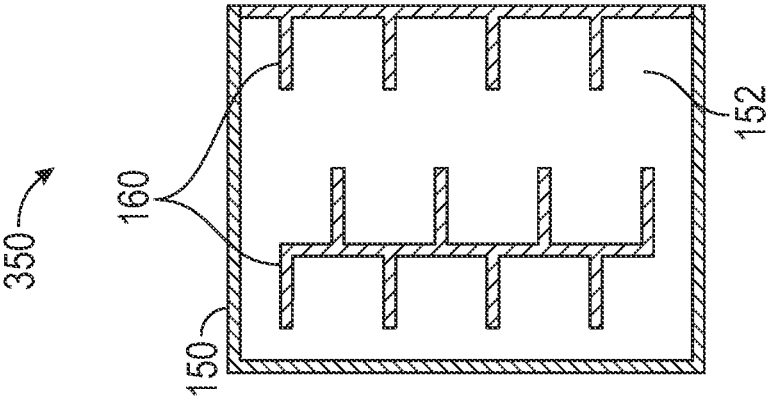

FIG. 3B illustrates top views of the power module cooling system 150 in FIG. 3A in accordance with embodiments of the present disclosure. In this example, the left figure shows a top-down view (e.g., in the X-Y plane orthogonal to the X-Z plane side view in FIG. 3A) of the first set of fins 160 within the chamber 152. The middle figure shows a top-down view of the second set of fins 170 within the chamber 152. The right figure shows the assembly of the first set of fins 160 and the second set of fins 170 within chamber 152 to form overlapping, alternating sets of fins. FIG. 3B further shows the flow 360 of the liquid coolant in the X-Y plane just as FIG. 3A shows the flow 310 of the liquid coolant in the X-Z plane. Among other things, cooling system 150 causes flows 310, 360 in the liquid coolant to generate swirls and tumbles in the liquid coolant as it passes through the chamber 152 between the inlet and outlet, thereby increasing the thermal conductivity of the cooling system 150 relative to systems that induce a flow in liquid coolants in only two dimensions.

Figure 4A:
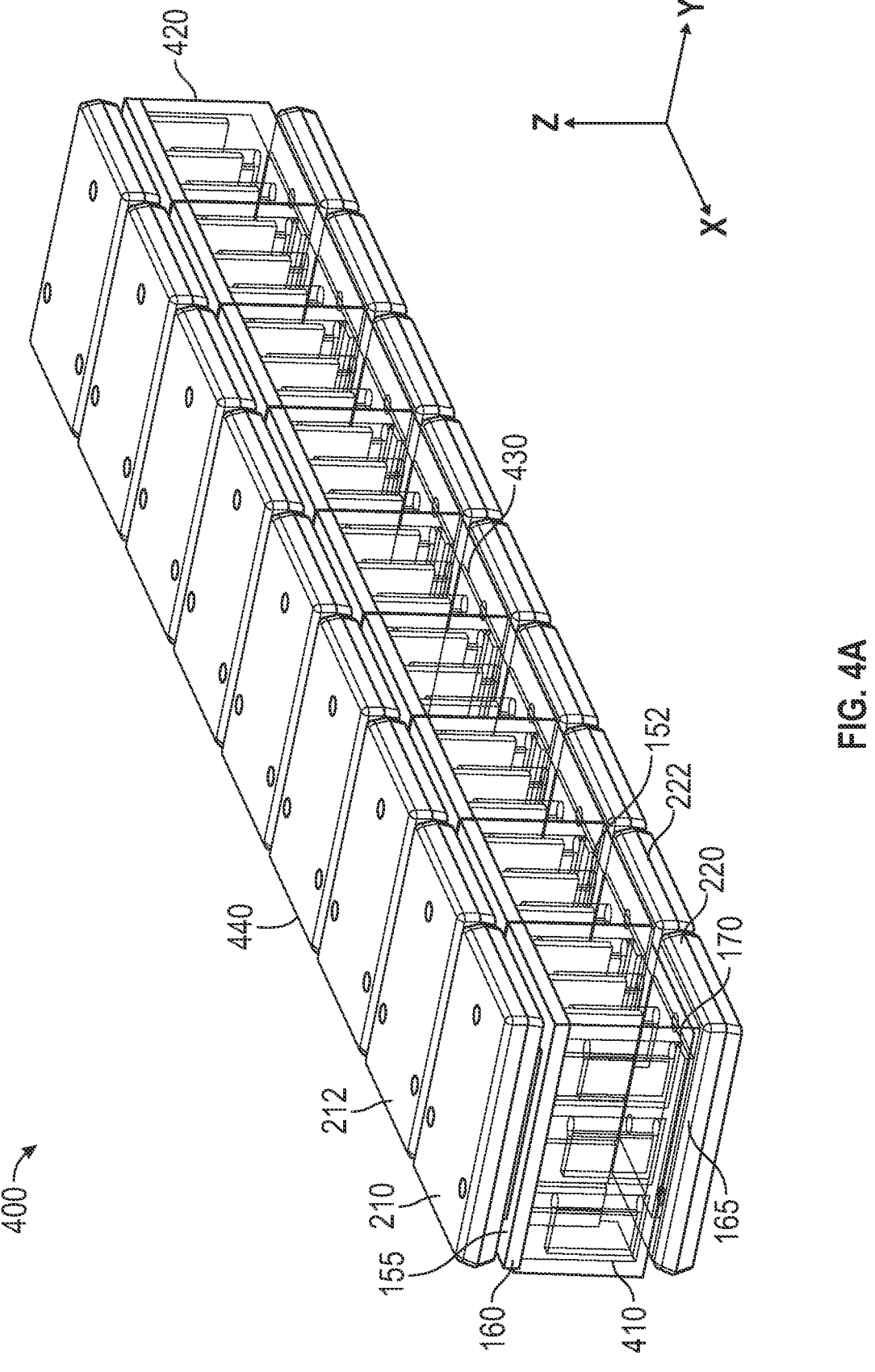
FIG. 4A is an example of a perspective view of a power module cooling system in accordance with embodiments of the present disclosure.

FIG. 4A is an example of a perspective view of a power module cooling system 400 in accordance with embodiments of the present disclosure. In this example, cooling system 400 comprises a housing having an elongated structure with chamber 152 formed by the top portion 155, bottom portion 165, first side 410, second side 420 opposite to the first side 410, third side 430, and fourth side 440 opposite to the third side 430. The housing of cooling system 400 has a length between the first side 410 and the second side 420, a width between a third side 430 and the fourth side 440 (where the length is greater than the width), and a height between the top portion 155 and the bottom portion 165. In alternate embodiments, the length of 410 and 420 may be longer than the length of 430 and 440.

Figure 4B:
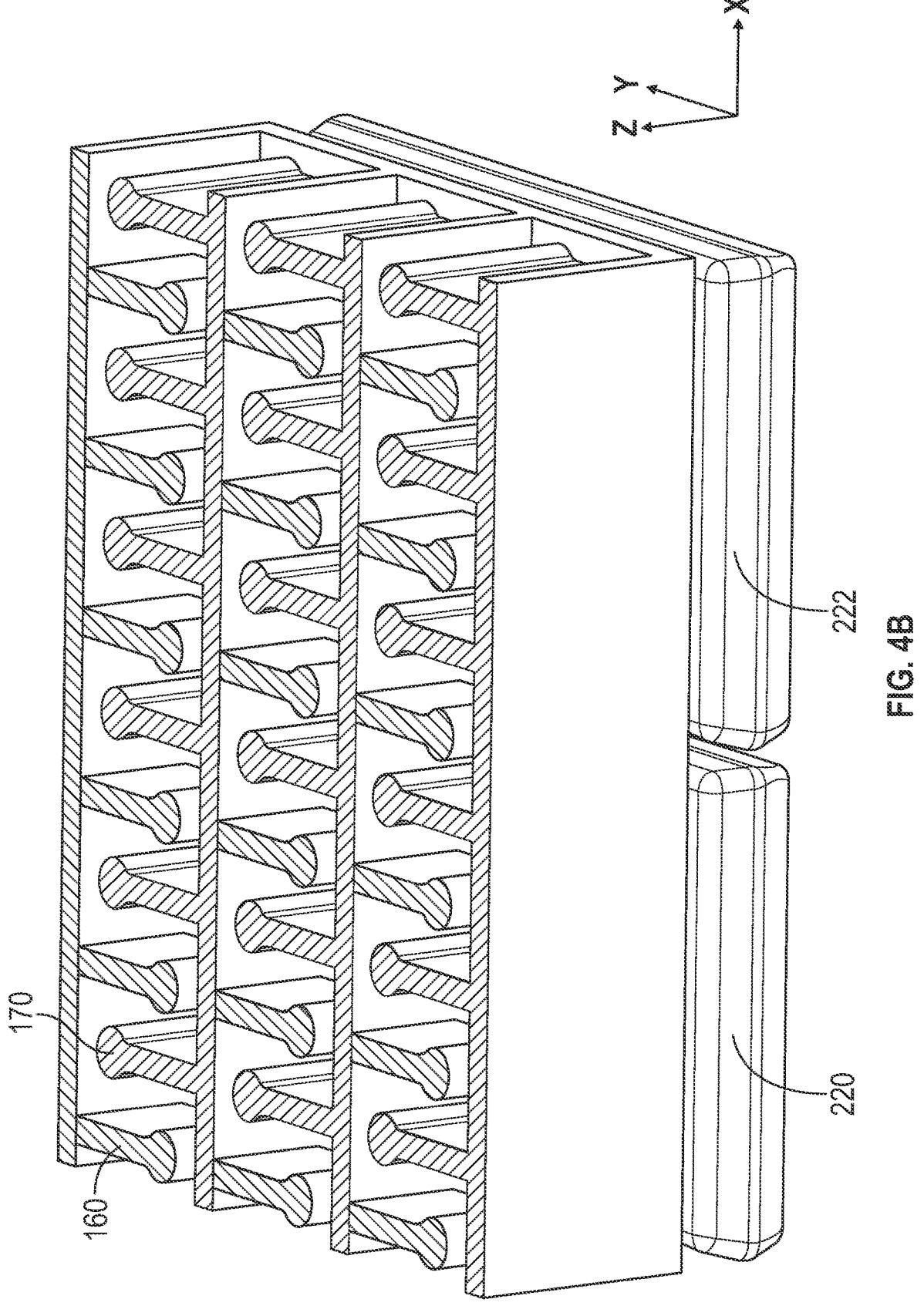
FIG. 4B is a partial cutaway perspective view of the power module cooling system in FIG. 4A in accordance with embodiments of the present disclosure.
Figure 4C:
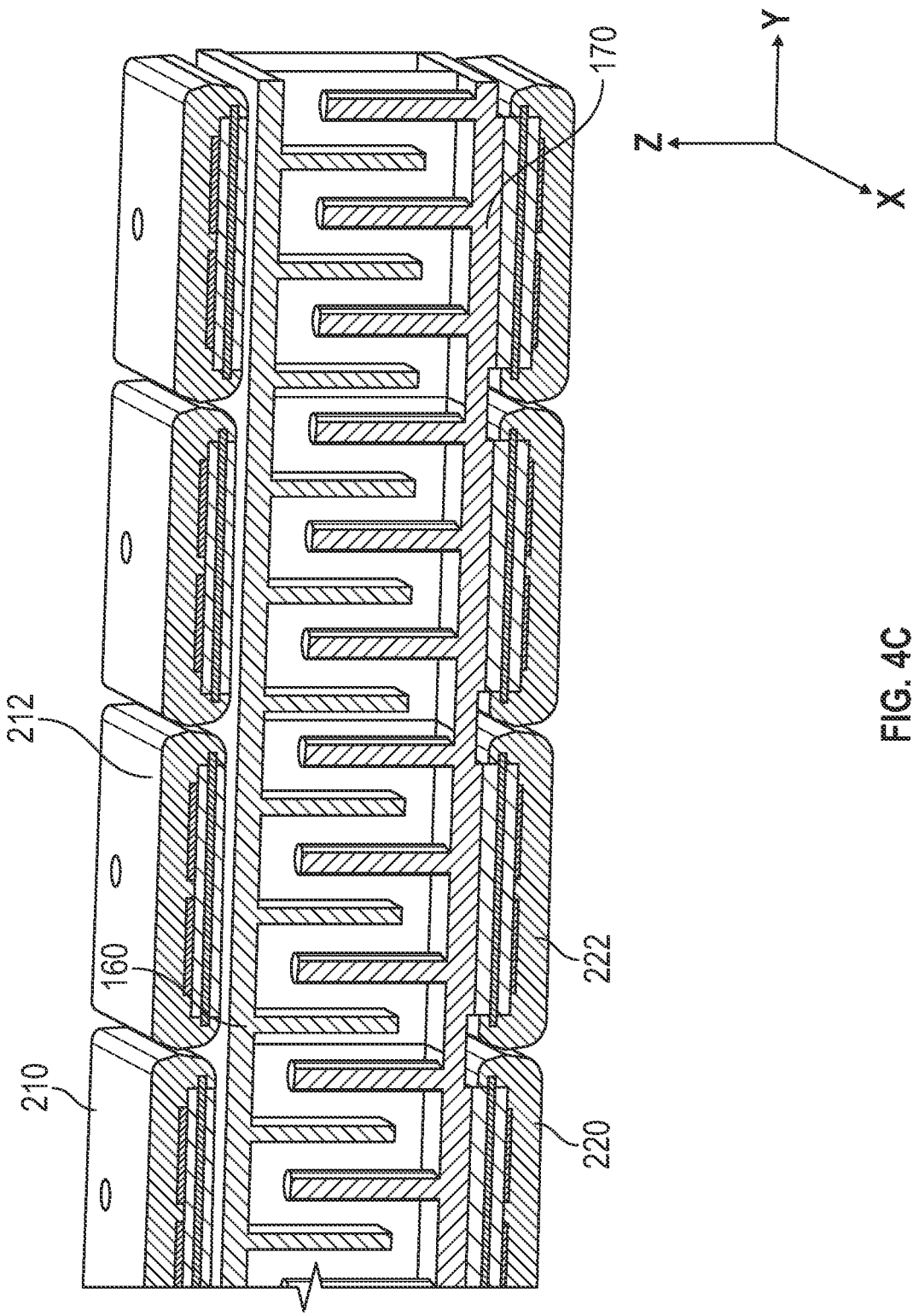
FIG. 4C is another partial cutaway perspective view of the power module cooling system in FIG. 4A in accordance with embodiments of the present disclosure.

As shown in this example, a plurality of power modules may be simultaneously cooled by the cooling system 400, such as power modules 210 and 212 coupled to the top portion 155 and power modules 220 and 222 coupled to the bottom portion 165. FIG. 4B is a partial cutaway perspective view of the power module cooling system 400 in FIG. 4A, while FIG. 4C provides another partial cutaway perspective view of the power module cooling system 400 in FIG. 4A.

Power module cooling systems of the present disclosure, such as cooling system 400 in FIG. 4A, may include any suitable number of inlets and outlets to allow liquid coolant to enter and exit the cooling system, respectively. Various embodiments may have different numbers of inlets and outlets, different sized inlets, different sized outlets, as well as different sizes of inlets relative to outlets. The inlets and outlets may be formed horizontally, vertically, or at any suitable angle in the housing of the cooling system. For example, in some embodiments the direction and angle of the inlets and outlets can be an optimized to minimize pumping loss and maximize flow rate.

For example, in some embodiments, the power module cooling system 400 may include one or more inlets in the first side 410 and one or more outlets 420 in the second side to cause the liquid coolant to flow along the length of the cooling system 400. Alternatively, the cooling system 400 may include one or more inlets in the third side and one or more outlets in the fourth side to cause the liquid coolant to flow across the width of the cooling system 400. In alternate embodiments, inlets and outlets may be formed in the top portion 155 and bottom portion 165.

Figure 5A:
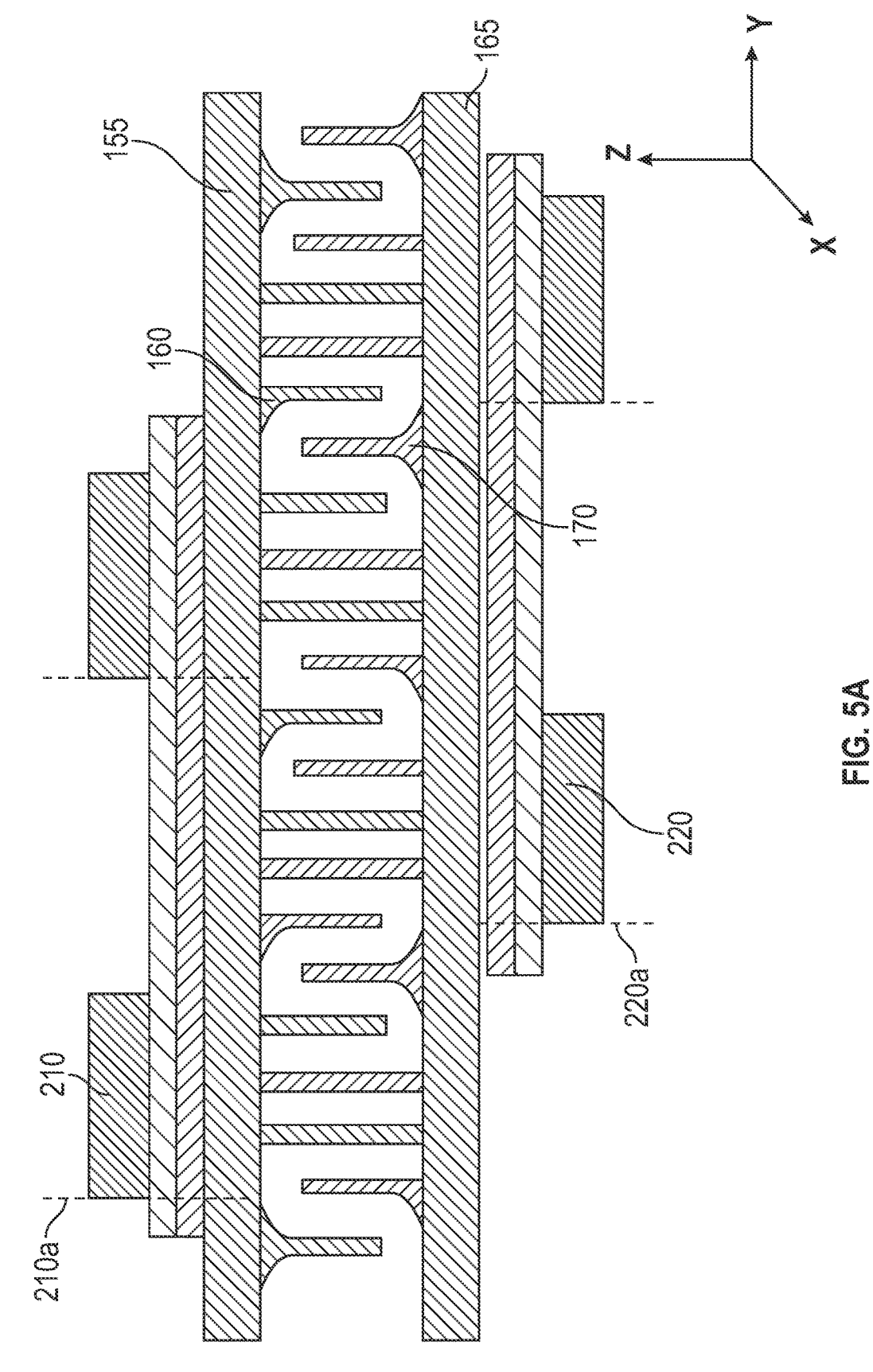
FIG. 5A is a side view of another power module cooling system in accordance with embodiments of the present disclosure.
Figure 5B:
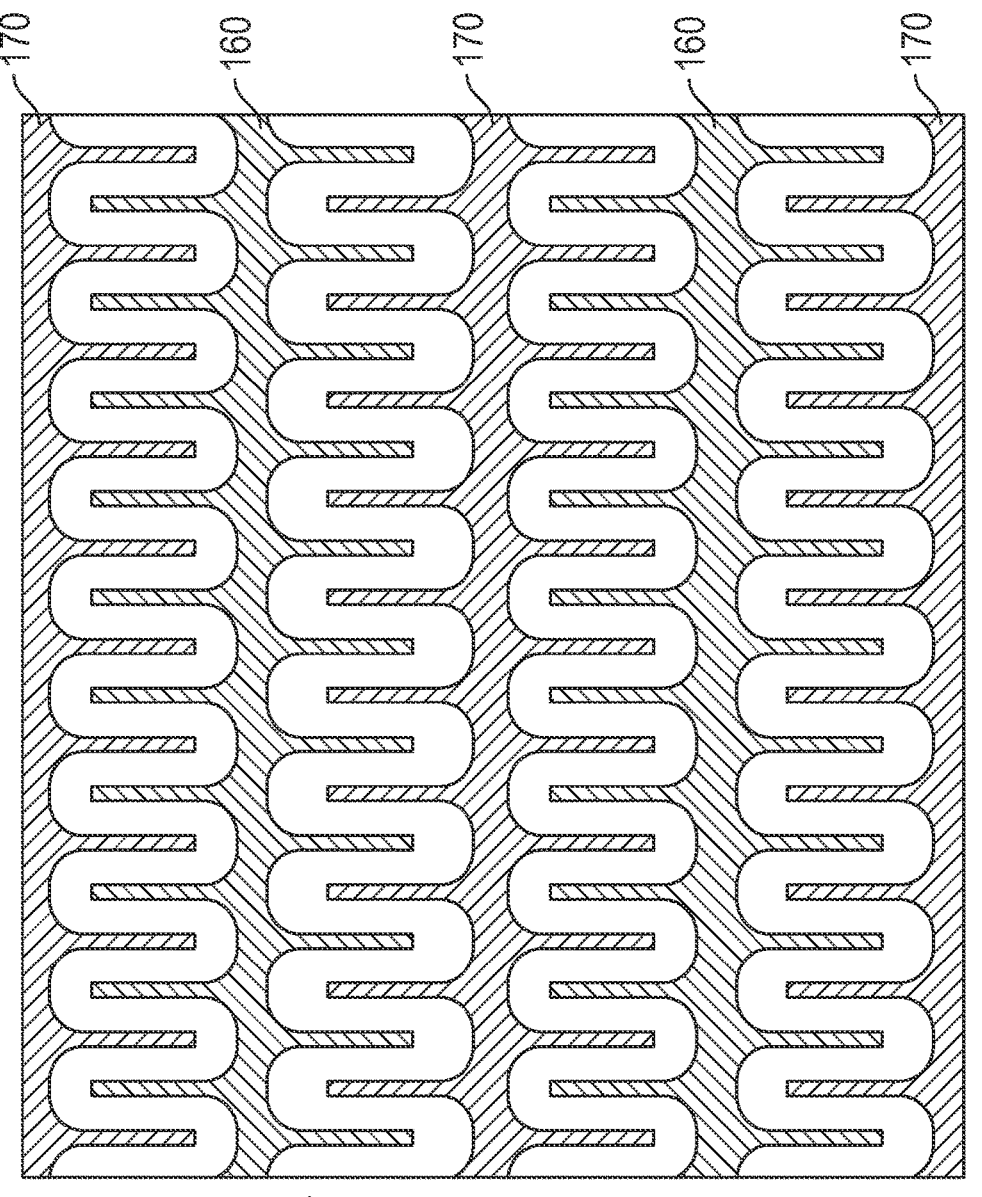
FIG. 5B is a top view of the power module cooling system in FIG. 5A in accordance with embodiments of the present disclosure.

FIG. 5A is a side view of another power module cooling system 500 in accordance with embodiments of the present disclosure. FIG. 5B is a top view of the power module cooling system 500 in FIG. 5A. The fins 160, 170 may have any suitable dimensions (e.g., length, width, height) and may be formed from any suitable material to help optimize thermal conductivity. In some embodiments, as illustrated in the example shown in FIG. 5A and FIG. 5B, a power module cooling system 500 may include one or more fins that are rounded at their respective connection to the top portion or the bottom portion. For example, FIG. 5A shows fin 160 extending from the top portion 155 having a rounded connection on one side of the fin 160 (and an angular connection on the other side), and fin 170 extending from the bottom portion 165 having a rounded connection on both sides of the fin 170.

Additionally, the cooling system 500 in FIG. 5A and FIG. 5B may create vertical turbulence partially for flow rate and turbulence optimization. For example, cooling system 500 provides open vertical flows where the cooling modules 210, 220 are not positioned until the respective front edges 210a, 220a of the power modules 210, 220. Among other things, this helps provide a lower pressure drop within the chamber of the cooling system 500 and adds vertical turbulence. Cooling system 500 may also close vertical flow and allow only flows in the X-Y plane at the locations under power modules 210, 220 to help partially increase the flow rate and turbulence in the X-Y plane. In the example shown in FIG. 5, the "○" symbols indicate flow of the liquid coolant in the X-direction and the "+" symbols indicate flow of the liquid coolant in the opposite X direction.

In some embodiments, the flow rate of the liquid coolant within the cooling system of the present disclosure may be optimized by adjusting the total cross-section area for the coolant's flow path. In some embodiments, this may be accomplished by adjusting the spacing between the fins 160, 170.

The terms "a" and "an" do not denote a limitation of quantity, but rather denote the presence of at least one of the referenced items. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A power module cooling system, comprising:
a housing having a chamber defined by a top portion, a bottom portion opposite the top portion, and a plurality of sides;
an inlet to allow a liquid coolant to enter the chamber;
an outlet to allow the liquid coolant to exit the chamber;
a first set of fins extending from the top portion into the chamber; and
a second set of fins extending from the bottom portion into the chamber, the first set of fins and the second set of fins defining a three-dimensional flow path for the liquid coolant, wherein the first set of fins do not contact the bottom portion, the second set of fins do not contact the top portion, and the first set of fins overlap the second set of fins in both a first plane and a second plane orthogonal to the first plane, and wherein:
at least one of the first set of fins has a first end connected to the top portion by a rounded connection, and a second end opposite the first end, the first end having an angular shape; and
at least one of the second set of fins has a third end connected to the bottom portion by a rounded connection, and a fourth end opposite the third end, the fourth end having an angular shape.

2. The power module cooling system of claim 1, wherein the housing has an exterior, the exterior of the top portion is adapted to couple to a first power module, and the exterior of the bottom portion is adapted to couple to a second power module, wherein the power module cooling system simultaneously cools the first power module and the second power module as the liquid coolant traverses the first set of fins and the second set of fins between the inlet and the outlet within the chamber.

3. The power module cooling system of claim 1, wherein the liquid coolant swirls and tumbles as the liquid coolant traverses the first set of fins and the second set of fins between the inlet and the outlet within the chamber.

4. The power module cooling system of claim 1, wherein the housing has a length between a first side and a second side opposite to the first side, a width between a third side and a fourth side opposite to the third side, and a height between the top portion and the bottom portion.

5. The power module cooling system of claim 4, wherein the inlet is in the first side and the outlet is in the second side, or the inlet is in the top portion and the outlet is in the bottom portion.

6. The power module cooling system of claim 4, wherein the length is greater than the width, and wherein the inlet is in the third side and the outlet is in the fourth side.

7. The power module cooling system of claim 1, wherein the first set of fins and the second set of fins define the three-dimensional flow path in a first portion of the housing, and define another flow path that prevents flow of the cooling fluid in a direction parallel to the first plane or the second plane.

8. The power module cooling system of claim 1, wherein the housing includes a plurality of inlets and a plurality of outlets.

9. A power module cooling system, comprising:
a housing having an exterior and a chamber defined by a top portion, a bottom portion opposite the top portion, and a plurality of sides;
an inlet to allow a liquid coolant to enter the chamber;
an outlet to allow the liquid coolant to exit the chamber;
a first set of fins extending from the top portion into the chamber; and
a second set of fins extending from the bottom portion into the chamber, the first set of fins and the second set of fins defining a three-dimensional flow path for the liquid coolant, wherein the first set of fins do not contact the bottom portion, the second set of fins do not contact the top portion, and the first set of fins overlap the second set of fins in both a first plane and a second plane orthogonal to the first plane, wherein the exterior of the top portion is adapted to couple to a first power module, the exterior of the bottom portion is adapted to couple to a second power module, wherein the power module cooling system simultaneously cools the first power module and the second power module as the liquid coolant traverses the first set of fins and the second set of fins between the inlet and the outlet within the chamber, and wherein:
at least one of the first set of fins has a first end connected to the top portion by a rounded connection, and a second end opposite the first end, the first end having an angular shape; and
at least one of the second set of fins has a third end connected to the bottom portion by a rounded connection, and a fourth end opposite the third end, the fourth end having an angular shape.

10. The power module cooling system of claim 9, wherein the liquid coolant swirls and tumbles as the liquid coolant traverses the first set of fins and the second set of fins between the inlet and the outlet within the chamber.

11. The power module cooling system of claim 9, wherein the housing has a length between a first side and a second side opposite to the first side, a width between a third side and a fourth side opposite to the third side, and a height between the top portion and the bottom portion.

12. The power module cooling system of claim 11, wherein the inlet is in the first side and the outlet is in the second side, or the inlet is in the top portion and the outlet is in the bottom portion.

13. The power module cooling system of claim 11, wherein the length is greater than the width, and wherein the inlet is in the third side and the outlet is in the fourth side.

14. The power module cooling system of claim 9, wherein the first set of fins and the second set of fins define the three-dimensional flow path in a first portion of the housing, and define another flow path that prevents flow of the cooling fluid in a direction parallel to the first plane or the second plane.

15. The power module cooling system of claim 9, wherein the housing includes a plurality of inlets and a plurality of outlets.

16. A vehicle comprising:
a first power module;
a second power module; and
a power module cooling system, comprising:
a housing having an exterior and a chamber defined by a top portion, a bottom portion opposite the top portion, and a plurality of sides;
an inlet to allow a liquid coolant to enter the chamber;
an outlet to allow the liquid coolant to exit the chamber;

a first set of fins extending from the top portion into the chamber; and a second set of fins extending from the bottom portion into the chamber, the first set of fins and the second set of fins defining a three-dimensional flow path for the liquid coolant, wherein the first set of fins do not contact the bottom portion, the second set of fins do not contact the top portion, and the first set of fins overlap the second set of fins in both a first plane and a second plane orthogonal to the first plane, wherein the exterior of the top portion is adapted to couple to the first power module, the exterior of the bottom portion is adapted to couple to the second power module, wherein the power module cooling system simultaneously cools the first power module and the second power module as the liquid coolant traverses the first set of fins and the second set of fins between the inlet and the outlet within the chamber, and wherein:

at least one of the first set of fins has a first end connected to the top portion by a rounded connection, and a second end opposite the first end, the first end having an angular shape; and at least one of the second set of fins has a third end connected to the bottom portion by a rounded connection, and a fourth end opposite the third end, the fourth end having an angular shape.

17. The vehicle of claim 16, wherein the liquid coolant swirls and tumbles as the liquid coolant traverses the first set of fins and the second set of fins between the inlet and the outlet within the chamber.

18. The vehicle of claim 16, wherein the housing has a length between a first side and a second side opposite to the first side, a width between a third side and a fourth side opposite to the third side, and a height between the top portion and the bottom portion.

19. The vehicle of claim 18, wherein the inlet is in the first side and the outlet is in the second side, or the inlet is in the top portion and the outlet is in the bottom portion.

20. The vehicle of claim 18, wherein the length is greater than the width, and wherein the inlet is in the third side and the outlet is in the fourth side.

* * * * *